United States Patent
Marathe et al.

(10) Patent No.: US 6,717,266 B1
(45) Date of Patent: Apr. 6, 2004

(54) USE OF AN ALLOYING ELEMENT TO FORM A STABLE OXIDE LAYER ON THE SURFACE OF METAL FEATURES

(75) Inventors: Amit P. Marathe, Milpitas, CA (US); Darrell M. Erb, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/175,393

(22) Filed: Jun. 18, 2002

(51) Int. Cl.[7] .................. H01L 23/48; H01L 21/283
(52) U.S. Cl. ............. 257/751; 257/762; 257/774; 257/773; 257/767; 257/752; 257/741; 257/761
(58) Field of Search .................. 257/748, 767, 257/774, 773, 700, 701, 758, 752, 760, 751, 762

(56) References Cited

U.S. PATENT DOCUMENTS

| | | | | |
|---|---|---|---|---|
| 5,471,364 A | * | 11/1995 | Summerfelt et al. ..... | 361/321.4 |
| 5,489,548 A | * | 2/1996 | Nishioka et al. ........... | 438/396 |
| 5,622,893 A | * | 4/1997 | Summerfelt et al. ....... | 438/396 |
| 5,696,018 A | * | 12/1997 | Summerfelt et al. ....... | 438/396 |
| 5,793,057 A | * | 8/1998 | Summerfelt ................. | 257/55 |
| 5,851,896 A | * | 12/1998 | Summerfelt ................ | 438/396 |
| 6,130,161 A | * | 10/2000 | Ashley et al. .............. | 438/687 |
| 6,258,710 B1 | * | 7/2001 | Rathore et al. ............ | 438/628 |
| 6,294,835 B1 | * | 9/2001 | Dalal et al. ................ | 257/760 |
| 6,319,819 B1 | * | 11/2001 | Besser et al. .............. | 438/633 |

* cited by examiner

*Primary Examiner*—Alexander Oscar Williams
(74) *Attorney, Agent, or Firm*—Foley & Lardner

(57) ABSTRACT

The electromigration resistance of planarized metallization patterns, for example copper, inlaid in the surface of a layer of dielectric material, is enhanced by a process comprising blanket-depositing on the planarized, upper surfaces of the metallization features and the dielectric layer at least one alloying layer comprising at least one alloying element for the metal of the features, and diffusing the at least one alloying element within the metallization features to effect alloying therewith. The at least one alloying element diffused within the metallization features, under conditions wherein an oxide layer forms on the surface of the metallization features, forms a stable oxide layer on the surface of the metallization features. The stable oxide layer reduces electromigration from the metallization features along the oxide layer.

8 Claims, 4 Drawing Sheets

USE OF AN ALLOYING ELEMENT TO FORM A STABLE OXIDE LAYER ON THE SURFACE OF METAL FEATURES

BACKGROUND OF THE INVENTION

1. Field of the Invention

The present invention relates to electrical devices, for example semiconductor integrated circuit devices, having inlaid ("damascene"-type) metallization patterns, for example interconnection lines, etc., and to a method for minimizing, or substantially preventing, deleterious electromigration of the metallic element(s) of the metallization pattern. More specifically, the present invention relates to semiconductor devices comprising copper (Cu) interconnection patterns and is applicable to manufacture of high speed integrated circuits having sub-micron dimensioned design features and high electrical conductivity interconnect structures.

2. Description of Related Art

The present invention relates to a method for forming metal films as part of metallization processing of particular utility in the manufacture of electrical and electronic devices, for example circuit boards and semiconductor integrated circuits, and is especially adapted for use in processing employing "inlaid" or "damascene"-type technology.

The escalating requirements for high density and performance associated with ultra-large scale integration (ULSI) semiconductor device wiring are difficult to satisfy in terms of providing sub-micron-sized (e.g., 0.18 $\mu$m and under), low resistance-capacitance (RC) time constant metallization patterns, particularly wherein the sub-micron-sized metallization features, such as vias, contact areas, lines, etc. require grooves, trenches, and other shaped openings or recesses having very high aspect (i.e., depth-to-width) ratios due to microminiaturization.

Semiconductor devices of the type contemplated herein typically comprise a semiconductor wafer substrate, usually of doped monocrystalline silicon (Si) or, in some instances, gallium arsenide (GaAs), and a plurality of sequentially formed interlayer dielectrics and electrically conductive patterns formed therein and/or therebetween. An integrated circuit is formed therefrom containing a plurality of patterns of conductive lines separated by interwiring spacings, and a plurality of interconnect lines, such as bus lines, bit lines, word lines, and logic interconnect lines. Typically, the conductive patterns of vertically spaced-apart metallization layers or strata are electrically interconnected by a vertically oriented conductive plug filling a via hole formed in the inter-layer dielectric layer separating the layers or strata, while another conductive plug filling a contact area hole establishes electrical contact with an active device region, such as a source/drain region of a transistor, formed in or on the semiconductor substrate. Conductive lines formed in groove- or trench-like openings in overlying inter-layer dielectrics extend substantially parallel to the semiconductor substrate. Semiconductor devices of such type fabricated according to current technology may comprise five or more layers or strata of such metallization in order to satisfy device geometry and microminiaturization requirements.

Electrically conductive films or layers of the type contemplated for use in, for example, "back-end" semiconductor manufacturing technology for fabricating devices having multi-level metallization patterns such as described supra, typically comprise a metal such as titanium (Ti), tantalum (Ta), tungsten (W), aluminum (Al), chromium (Cr), nickel (Ni), cobalt (Co), silver (Ag), gold (Au), copper (Cu) and their alloys. In use, each of the enumerated metals presents advantages as well as problems. For example, Al is relatively inexpensive, exhibits low resistivity, and is relatively easy to etch. However, in addition to being difficult to deposit by lower cost, lower temperature, more rapid "wet" type technology such as electrodeposition, step coverage with Al is poor when the metallization features are scaled down to sub-micron size, resulting in decreased reliability of interconnections, high current densities at certain locations, and increased electromigration. In addition, certain low dielectric constant materials, for example polyimides, when employed as dielectric inter-layers, create moisture/bias reliability problems when in contact with Al.

Cu and Cu-based alloys are particularly attractive for use in large scale integration (LSI), very large-scale integration (VLSI), and ultra-large scale (ULSI) semiconductor devices requiring multi-level metallization systems for "back-end" processing of the semiconductor wafers on which the devices are based. Cu- and Cu alloy-based metallization systems have very low resistivities, i.e., significantly lower than that of W and even lower than those of previously preferred systems utilizing Al and its alloys, as well as a higher (but not complete) resistance to electromigration. Moreover, Cu and its alloys enjoy a considerable cost advantage over a number of the above-enumerated metals, notably Ag and Au. Also, in contrast to Al and the refractory-type metals (e.g., Ti, Ta, and W), Cu and its alloys can be readily deposited at low temperatures in good quality, bright layer form by well-known "wet" plating such as electroless and electroplating techniques, at deposition rates fully compatible with the requirements of device manufacturing throughput.

As indicated above, a commonly employed method for forming "inlaid" metallization patterns as are required for "back-end" metallization processing of semiconductor wafers employs "damascene"-type technology. Generally, in such processing methodology, a recess (i.e., an opening for forming, for example, a via hole, in a dielectric layer for electrically connecting vertically separated metallization layers, or a groove or trench for a metallization line) is created in the dielectric layer by conventional photolithographic and etching techniques, and filled with a selected metal. Any excess metal overfilling the recess and/or extending over the surface of the dielectric layer is then removed by, for example, chemical-mechanical polishing (CMP), wherein a moving pad is biased against the surface to be polished/planarized, with the interposition of a slurry containing abrasive particles (and other ingredients) therebetween.

A variant of the above-described technique, termed "dual damascene" processing, involves the formation of an opening comprising a lower contact or via hole section in communication with an upper groove or trench section, which opening is filled with a conductive material, typically a metal, to simultaneously form a conductive via plug in electrical contact with a conductive line.

Referring now to FIGS. 1A–1C, schematically shown therein in simplified cross-sectional view, is a conventional damascene-type processing sequence employing relatively low cost, high manufacturing throughput plating and CMP techniques for forming recessed "back-end" metallization patterns (illustratively of Cu-based metallurgy but not limited thereto) in a semiconductor device formed in or on a semiconductor wafer substrate 1. As shown in FIG. 1A, the desired arrangement of conductors is defined as a pattern of recesses 2 such as via holes, grooves, trenches, etc. formed (as by conventional photolithographic and etching techniques) in the surface 4 of a dielectric layer 3 (e.g., a silicon oxide and/or nitride or an organic polymeric material) deposited or otherwise formed over the semiconductor substrate 1. Then, as shown in FIG. 1B, a layer of conductive metal 5, for example Cu or Cu-based alloy, is deposited by conventional plating techniques, for example electroless or electroplating techniques, to fill the recesses 2. In order to ensure complete filling of the recesses, the conductive metal 5 is deposited as a blanket (or "overburden") layer of excess thickness so as to overfill the recesses 2 and cover the upper surface 4 of the dielectric layer 3. Next, as shown in FIG. 1C, the entire excess thickness t of the overburden layer of conductive metal 5 over the surface of the dielectric layer 3 is removed by a CMP process utilizing an alumina (Al2O3)-based slurry, leaving metal portions 5 in the recesses 2 with their exposed upper surfaces 6 substantially co-planar with the surface 4 of the dielectric layer 3.

The above-described conventional damascene-type process forms inlaid conductors (metal portions 5 ) in the dielectric layer 3 while avoiding problems associated with other types of metallization patterning processing, for example blanket metal layer deposition, followed by photolithographic masking/etching and dielectric gap filling. In addition, such single or dual damascene-type processing can be performed with a variety of other types of substrates, for example printed circuit boards, with and/or without intervening dielectric layers, and with a plurality of metallization levels, i.e., five or more levels.

A problem associated with Cu-based "back-end" metallization is the possibility of Cu diffusion into adjacent structures, for example an underlying semiconductor substrate (typically Si) or a dielectric layer, resulting in degradation of semiconductive or insulative properties, as well as poor adhesion of the deposited Cu or Cu alloy layer to various materials employed as dielectric inter-layers, etc. As a consequence of these phenomena associated with Cu-based metallurgy, it is generally necessary to provide an adhesion and/or diffusion barrier layer intermediate the semiconductor substrate and the overlying Cu-based metallization layer (not shown in FIGS. 1A through 1C). Suitable materials for such adhesion/barrier layers include, for example, Ti, W, Cr, Ta, and tantalum nitride (TaN).

Another problem associated with the use of Cu or Cu-based metallurgy for "back-end" metallization processing of semiconductor devices, results from the undesirable formation of Cu oxide(s), for example Cu2O, CuO, CuO2, etc., on the planarized Cu or Cu-based alloy surfaces of the inlaid metallization features as a result of oxidation, etc., due to the strong chemical oxidizing agents conventionally included in CMP slurries for enhancing Cu dissolution/removal rates and/or as a result of exposure of the freshly abraded Cu-based surfaces to an oxidizing atmosphere, for example air or oxygen. The thickness of the Cu oxide layer can vary depending upon the particular CMP processing conditions, for example stronger oxidizing agents contained in the CMP slurry result in thicker oxide layers, as does increased duration of exposure of freshly abraded, post CMP Cu surfaces to oxidizing atmospheres, for example air.

Cu oxide-containing layer(s), when formed as described above, disadvantageously increase contact resistance and reduce or prevent adhesion of layers thereto, for example silicon nitride-based capping layers. Moreover, the Cu oxide layers are brittle, increasing the likelihood of circuit disconnect or reduced conductivity due to separation, as by peeling, of the Cu oxide layer from conductor layers in contact therewith. Yet another disadvantage attributable to the presence of Cu oxide at the interface between adjacent electrical conductors results from the rapid diffusion of Cu atoms and/or ions along the oxide layer. The latter characteristic of Cu oxide layers disadvantageously results in enhanced material transport during electrical current flow and thus increases the electromigration of Cu atoms and/or ions along Cu-based conductor lines.

Electromigration occurs in extended runs or lengths of metal conductor lines carrying significant currents. According to a conventional theory for explaining the mechanism of electromigration, the current flow within the conductor line can be sufficient to result in movement of Cu atoms and/or ions along the line via momentum transfer engendered by collision of the Cu atoms and/or ions with energetic, flowing electrons. The current flow also creates a thermal gradient along the conductor length which increases the mobility of the metal ions and/or atoms. As a consequence of the momentum transfer and the thermally enhanced mobility, metal (Cu) ions and/or atoms diffuse in the direction of the gradient, and metal (Cu) loss at the source end of the conductor eventually results in thinning of the conductor line. The electromigration effect can continue until the conductor line becomes so thin that it separates from the current input or forms an open circuit, resulting in circuit (i.e., semiconductor chip) failure. As this usually occurs over an extended period of operation, the failure is often seen by the end-user.

Therefore, as an additional step in the fabrication process, a treatment of the Cu and/or Cu alloy surface with a reducing agent such as ammonia ($NH_3$) plasma is performed in order to reduce or eliminate any Cu oxide-containing layers formed on the Cu and/or Cu alloy surface as a result of the CMP process. Although the reducing agent treatment may advantageously remove any surface oxides, the elevated temperatures involved in the treatment may disadvantageously cause the formation of hillocks and other defects on the Cu and/or Cu alloy surface. Thus, the reducing agent treatment may undesirably increase the defect density on the surface of the Cu and/or Cu alloy pattern.

Thus, there exists a need for metallization process methodology which avoids the above-mentioned problems associated with oxide (particularly Cu oxide) formation on the metal surface, electromigration, and increased defect density, and which enables formation of metallization members, for example interconnect and routing lines (particularly of Cu or Cu-based alloys) having high reliability, high product yield, improved electromigration resistance, and high performance. In particular, there exists a need for eliminating the problems associated with electromigration and oxide layer formation resulting from CMP processing to form "inlaid", "damascene"-type Cu-based metallization patterns. Moreover, there exists a need for improved metallization processing technology which is fully compatible with conventional process flow, methodology, and throughput requirements in the manufacture of integrated circuit semiconductor devices and other devices requiring "inlaid" metallization patterns.

SUMMARY OF THE DISCLOSURE

Embodiments of the invention pertain to a method of manufacturing an electrical or electronic device having highly reliable, electromigration-resistant metallization patterns.

Additional embodiments of the invention pertain to a method of manufacturing a semiconductor integrated circuit device having highly reliable, electromigration-resistant Cu-based metallization patterns.

Yet other embodiments of the invention pertain to a method of manufacturing "inlaid", "damascene"-type Cu-based metallization patterns having improved reliability, high conductivity, and improved electromigration resistance.

Yet other embodiments of the invention pertain to a semiconductor device comprising a substrate including at least one damascene-type metal feature inlaid in the upper, exposed surface of a layer of dielectric material overlying at least a portion of the substrate. The at least one metal feature comprises an alloy of a conductive metal and at least one alloying element such that under conditions wherein an oxide layer forms on the surface of the at least one metal feature, the at least one alloying element forms a more stable oxide layer on the surface of the metal feature than an oxide layer that would be formed on the surface of the metal feature in the absence of the diffused at least one alloying element. Thus a more stable oxide layer is formed on the surface of the metal feature which reduces electromigration of atoms and/or ions from the metal feature along the oxide layer.

In accordance with preferred embodiments, a substrate is provided which may include at least one damascene-type metal feature inlaid in the upper, exposed surface of a layer of dielectric material overlying at least a portion of the substrate, the at least one metal feature including an upper, exposed surface substantially co-planar with the upper surface of the layer of dielectric material. At least one layer comprising at least one alloying element for the metal feature may then be deposited on the exposed, upper surface of the at least one metal feature and on the upper surface of the layer of dielectric material.

The at least one alloying element may then be diffused within the at least one metal feature such that under conditions wherein an oxide layer forms on the surface of the at least one metal feature, the at least one alloying element forms a more stable oxide layer on the surface of the metal feature than an oxide layer that would be formed on the surface of the metal feature in the absence of the diffused at least one alloying element, thus reducing electromigration of atoms and/or ions from the metal feature along the oxide layer. Any remaining portion of the at least one alloying element which extends above the upper, exposed surface of the layer of dielectric material after diffusing the at least one alloying element within the at least one metal feature may then be removed.

In a preferred embodiment of the invention, the electrical device may comprise a semiconductor integrated circuit device and the substrate may comprise a semiconductor wafer of monocrystalline silicon (Si) or gallium arsenide (GaAs) having a major surface, with the dielectric layer being formed over at least a portion of the major surface, and the at least one damascene-type, inlaid metal feature may comprise a plurality of unalloyed Cu features for providing vias, interlevel metallization, and/or interconnection lines of at least one active device region or component formed on or within the semiconductor wafer.

The at least one alloying element may include, but is not limited to, at least one of tin (Sn), zirconium (Zr), magnesium (Mg), and palladium (Pd) and may form a stable oxide layer including, but not limited to, at least one of tin oxide (SnO), zirconium oxide (ZrO2), magnesium oxide (MgO), and palladium oxide (PdO2). The stable oxide layer reduces electromigration of Cu atoms and/or ions from the Cu features along the oxide layer. The at least one alloying element may be blanket-deposited by a physical vapor deposition (PVD) process and may be diffused within the at least one Cu feature by an annealing process. The remaining portion of the at least one layer may then be removed by a chemical-mechanical polishing process. A silicon nitride encapsulation layer may then be deposited over the at least one metal feature and the upper, exposed surface of the layer of dielectric material.

These and other objects, features, and advantages of embodiments of the invention will be apparent to those skilled in the art from the following detailed description of embodiments of the invention, when read with the drawings and appended claims.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description of preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the invention.

The present invention addresses and solves problems arising from manufacturing electrical devices comprising inlaid metallization patterns, for example semiconductor integrated circuit devices, wherein, as part of the fabrication methodology, a plurality of recesses formed in the surface of a dielectric layer overlying a semiconductor substrate comprising at least one active device region or component are filled with a metal, illustratively Cu, which is subject to electromigration when the device is in use. More specifically, the present invention enables the formation of inlaid metallization patterns, for example of Cu-based metallurgy, in which the tendency for electromigration of the principal metallic element or component is minimized or substantially prevented. The present invention further enables the formation of inlaid metallization patterns which provide low contact resistance and good adhesion of layers thereto, for example silicon nitride-based capping layers. The present invention further enables the formation of inlaid metallization patterns which provide a less brittle oxide layer, thus decreasing the likelihood of circuit disconnect or reduced conductivity due to separation, as by peeling, of the oxide layer from conductor layers in contact therewith.

Figure 1A:
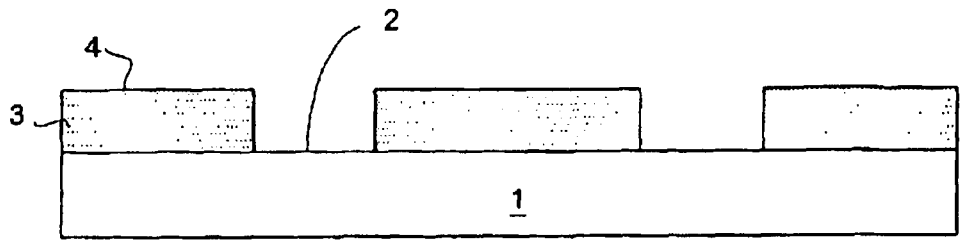
FIGS. 1a, 1b and 1c illustrate, in simplified, cross-sectional schematic form, a process for forming a pattern of damascene-type, inlaid Cu metallization features according to conventional practices for manufacture of semiconductor integrated circuit devices.
Figure 1B:
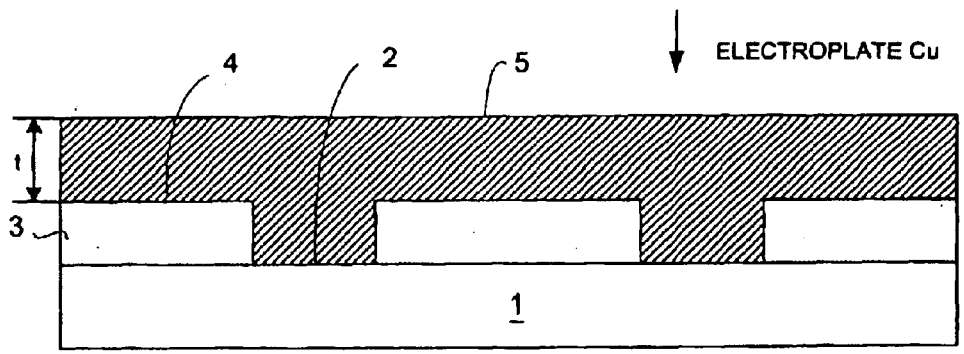
Figure 1C:
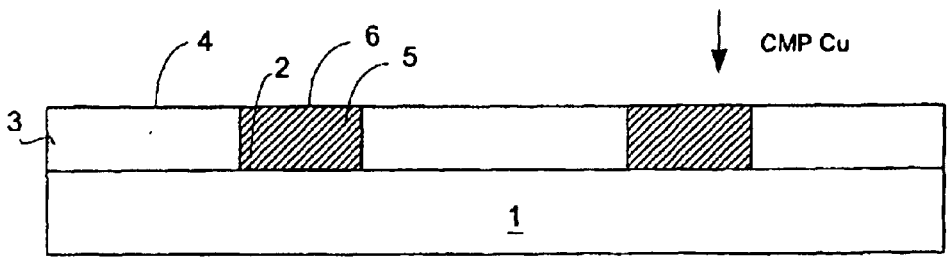

The present invention enables the formation of inlaid metallization patterns comprising at least one alloying element which, under conditions wherein an oxide layer forms on the surface of the metallization pattern(s), forms a more stable oxide layer on the surface of the metal feature than an oxide layer (comprising, for example, Cu oxides such as $Cu_2O$, $CuO$, and/or $CuO_2$) that would be formed on the surface of the metal feature in the absence of the diffused at least one alloying element by means of techniques which are fully compatible with the requirements of automated manufacturing technology and product throughput. Briefly stated, according to the present invention, conventional damascene-type methodology (such as illustrated in FIGS. 1A through 1C) is employed for forming an inlaid metallization pattern in a dielectric layer overlying a suitable substrate, for example a semiconductor wafer comprising at least one active device region or component, by which processing an unalloyed metal, for example Cu, is utilized for filling the pattern of recesses in the dielectric layer. At least one alloying element for the unalloyed metal is then blanket-deposited on the exposed, upper surface(s) of the feature(s) of the metallization pattern and on the exposed, upper surface of the dielectric layer, and the thus-produced structure subjected to thermal processing, for example annealing in an inert atmosphere, to substantially uniformly diffuse into, and alloy with, at least a portion of the metal (e.g., Cu) filling the recess pattern.

Any excess alloyed and/or unalloyed, elevated portions of the at least one layer comprising at least one alloying element remaining after diffusion/alloying may then be removed, as by CMP, thereby making the exposed, upper surface of the inlaid metal feature(s) of the metallization pattern substantially co-planar with the exposed, upper surface of the dielectric layer. Thus, after the diffusion of the at least one alloying element within the unalloyed metal, oxides which may form on the upper surface(s) of the feature(s) of the metallization pattern may be more chemically and mechanically stable, electromigration-resistant oxides. Such oxides may not have the above-described deleterious effects of some other oxides, for example $Cu_2O$, $CuO$, and/or $CuO_2$, and their removal may not be required.

Thus, electromigration of the metal may be advantageously minimized or substantially prevented, while at the same time avoiding the additional process of exposing the metal surface(s) to a reducing agent for removing any deleterious oxide therefrom, and thus avoiding the increases in defect density on the metal surface(s) resulting therefrom.

An embodiment of the present invention will now be described with reference to FIGS. 2A through 2E, which show, in simplified, cross-sectional, schematic fashion, an illustrative, but not limiting, embodiment of the present invention comprising a process performed on a semiconductor wafer substrate-based workpiece produced according to the process illustrated in FIGS. 1A through 1C, wherein similar reference numerals are used throughout to denote similar features. As will be apparent to one of ordinary skill in the art, the inventive methodology is readily adapted for use in the manufacture of a variety of electrical and electronic devices utilizing inlaid metallization patterns, for example printed circuit boards and integrated circuit devices. It should also be recognized that the processes and structures described below do not necessarily form a complete process flow for manufacturing such devices. However, the present invention can be used in conjunction with conventional technology currently employed in the art, for example integrated circuit fabrication methodology, and, consequently, only so much of the commonly practiced processes are included here as are necessary for an understanding of the present invention. As employed throughout the disclosure and claims, the term "substrate" and/or "semiconductor wafer substrate" includes, for example, a semiconductor substrate per se or an epitaxial layer formed on a suitable semiconductor substrate. Finally, the drawing figures representing cross-sections of portions of a semiconductor device during fabrication processing are not drawn to scale, but instead are drawn as to best illustrate the features of the present invention.

Figure 2A:
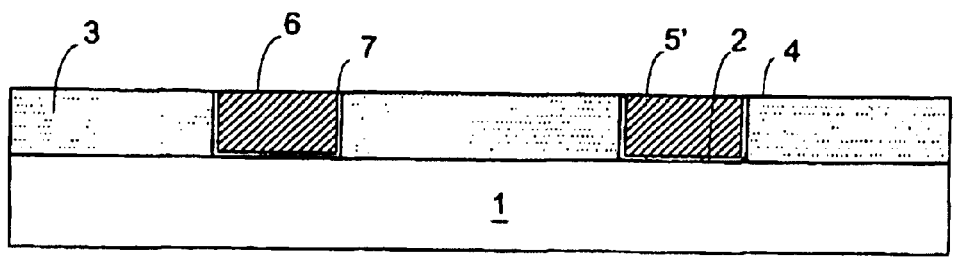
FIGS. 2a, 2b, 2c, 2d and 2e illustrate, in simplified, cross-sectional schematic form, a process for depositing and diffusing at least one alloying element into the metallization features of FIGS. 1a–1c according to the inventive methodology.

Referring now to FIG. 2A, according to the present invention, a semiconductor substrate-based workpiece similar to that shown in FIG. 1C is provided, having a desired inlaid metallization pattern, comprising a semiconductor wafer substrate 1, a dielectric layer 3 overlying substrate 1 and having recesses formed in the exposed, upper surface 4 thereof, and metal portions 5' of an unalloyed metal, illustratively Cu, filling the recesses 2, the exposed, upper surfaces 6 of the metal portions 5' being substantially co-planar with the exposed, upper surface 4 of the dielectric layer 3. Interposed between the sidewalls and bottom surface of the recesses and metal portions 5' is a diffusion barrier layer 7 for preventing diffusion of atoms and/or ions of the metal portions 5' into the dielectric layer 3 and/or semiconductor wafer substrate 1.

In the illustrated structures, semiconductor substrate 1 typically comprises a wafer of monocrystalline Si or GaAs, layer 3 comprises an insulative material typically utilized as an inter-layer dielectric (ILD), i.e., an inorganic material such as a silicon oxide, nitride, or oxynitride, or an organic-based or derived material, such as parylene, benzocyclobutene (BCB), etc. Suitable materials for barrier layer 7 include, for example, Ti, W, Cr, Ta, and TaN.

Recesses 2 formed in the upper, exposed surface 4 of dielectric layer 3 are utilized for forming vias, inter-level metallization, and/or interconnection routing of at least one active device region or component formed on or within semiconductor wafer substrate 1 and typically include high aspect (i.e., depth-to-width) ratios greater than one, sub-micron or micron-sized dimensions, and sub-micron or micron-sized dimensions, i.e., widths of from about 0.08 to about 3.0 $\mu$m and depths of from about 0.4 to about 2.0 $\mu$m.

Figure 2B:
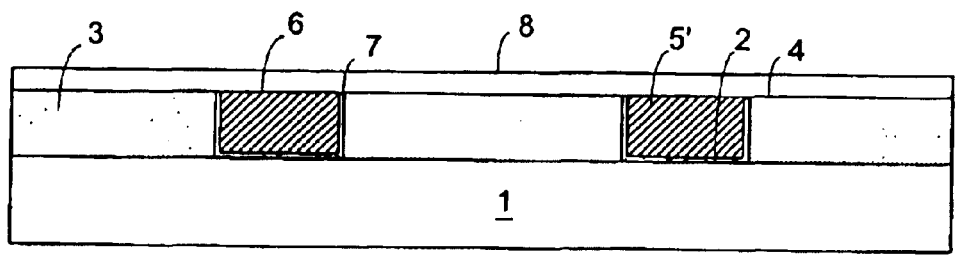

As shown in FIG. 2B, according to the inventive methodology, at least one thin alloying layer 8 comprising at least one alloying element for the conductive metal 5 of the inlaid metal feature(s) of the metallization pattern is first blanket-deposited on the exposed, upper surfaces, 6 and 4, respectively, of the metal portions 5' and the dielectric layer 3, as by a suitable physical vapor deposition (PVD) technique, including, but not limited to, sputtering, ion plating, and vacuum evaporation. According to the present invention, the thickness(es) of the at least one thin alloying layer 8 comprising at least one alloying element may be in the range of 20 nm to 80 nm for a Cu—Al alloy.

Alloying layer 8 can, depending, inter alia, upon the particular conductive metal 5 and choice of alloying element (s), comprise a single layer including one or more alloying elements, for example two alloying elements, or alternatively, can comprise two or more overlying layers, each containing a single alloying element. The latter alternative may be preferred when co-deposition of multiple alloying elements in single layer form is impractical or results in poor control of the relative amounts of the alloying elements, and therefore, poor composition control and/or uniformity of the desired alloy.

Figure 2C:
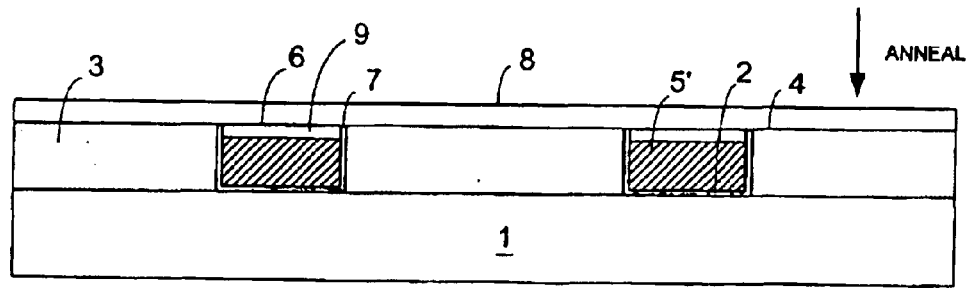

Referring now to FIG. 2C, according to the inventive methodology, the at least one alloying layer 8 is subjected to a treatment for effecting diffusion into and alloying with the underlying conductive metal 5 of the metal portions 5', as by a thermal treatment. More specifically, diffusion/alloying can be effected by annealing at an elevated temperature in an inert atmosphere, for example nitrogen ($N_2$) or a rare gas such as argon (Ar). In one example, a Cu—Sn alloy may be annealed at a temperature of 200–400 degrees C. to achieve this diffusion. Given the disclosure and objective(s) of the present invention, suitable annealing conditions for use with other alloying elements and metal features may be optimized for use in a particular application.

Figure 2D:
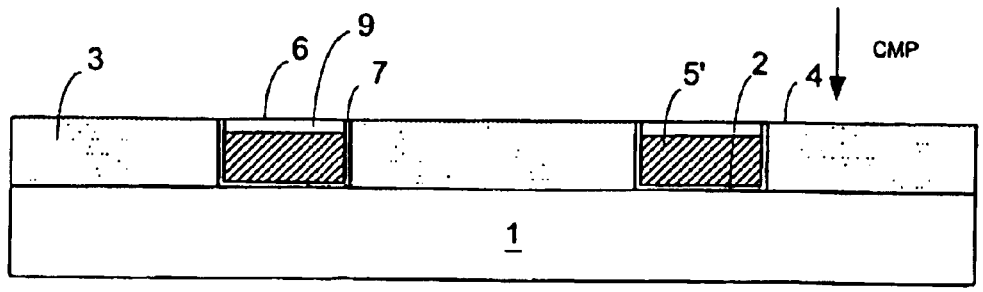
Figure 2E:
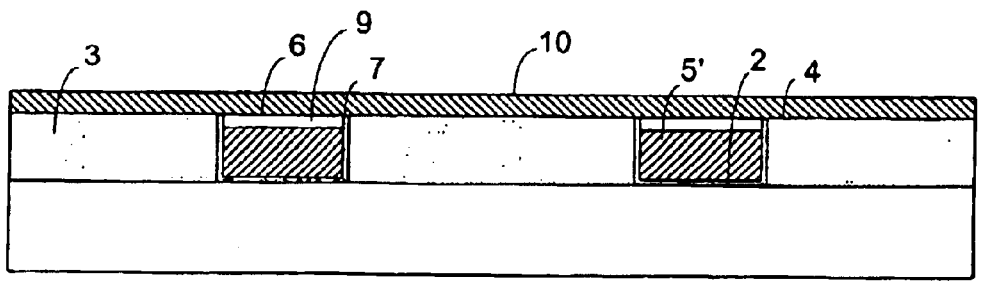

As illustrated in FIG. 2C, alloying layer portions 8' may remain on or over the upper surfaces 6 and 4, respectively, of the metal portions 5' and the dielectric layer 3 after completion of the diffusion/alloying treatment. As illustrated in FIG. 2D, according to the inventive methodology, any such remaining alloying layer portions 8' may be removed, for example by etching or CMP, thereby re-establishing co-planarity of the upper surface 6 of the inlaid metal portions(s) 5' and the upper surface 4 of the dielectric layer 3. Thus, a planarized, inlaid metallization pattern having alloyed portion 9 at the upper surface 6 may be produced. As illustrated in FIG. 2E, an encapsulating layer 10 may be deposited over the upper surfaces 6 and 4, respectively, of the metal portions 5' and the dielectric layer 3 after completion of the removal of any remaining alloying layer portions 8'. Encapsulating layer 10 may act as a passivation layer to encapsulate the metallization features and may comprise, for example, silicon nitride.

Figure 3:
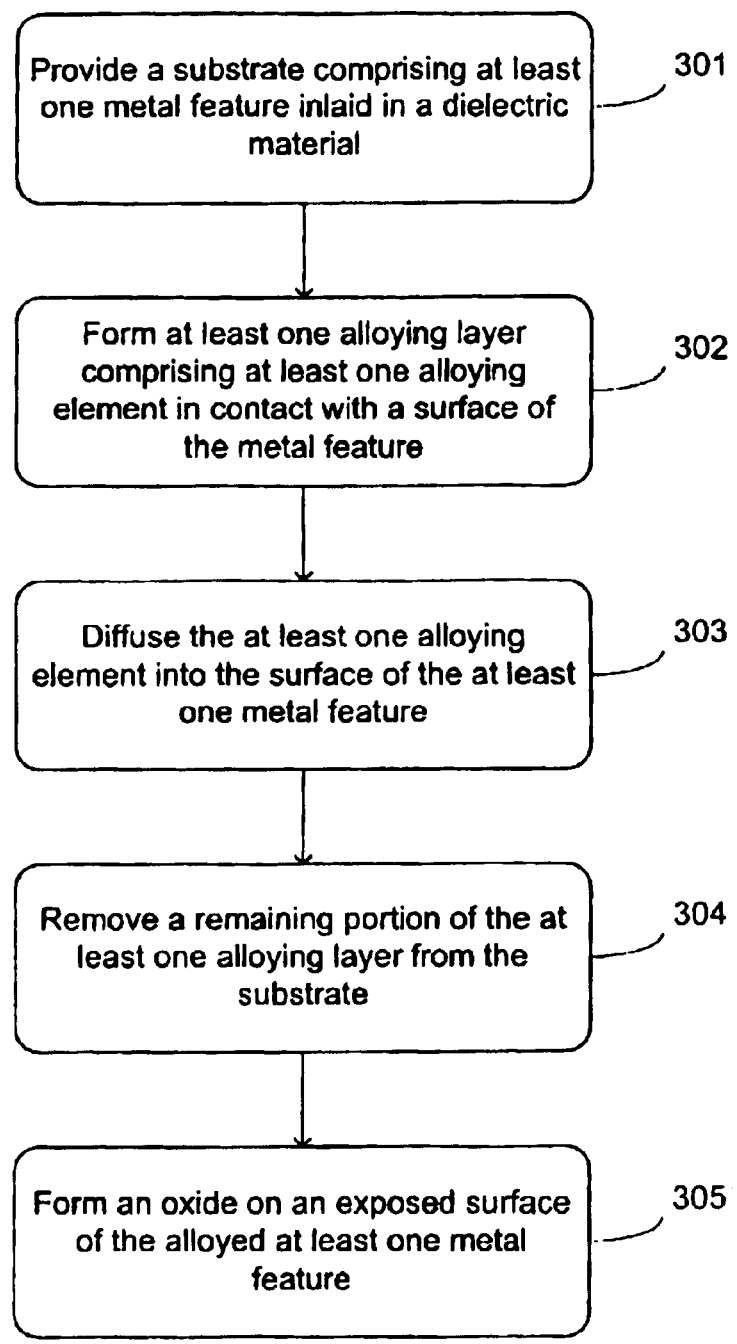
FIG. 3 shows a process flow diagram illustrating an embodiment of the present invention.

FIG. 3 shows a process flow diagram illustrating an embodiment of the present invention. The process flow diagram encompasses the preferred embodiment of the present invention, as well as other alternative embodiments. Initially, at 301, a substrate comprising at least one metal feature inlaid in a dielectric material is provided. Next, at 302, at least one alloying layer comprising at least one alloying element in contact with a surface of the metal feature is formed. Then, at 303, the at least one alloying element is diffused into the surface of the at least one metal feature. Next, at 304, a remaining portion of the at least one alloying layer is removed from the substrate. Then, at 305, an oxide is formed on an exposed surface of the alloyed at least one metal feature. In accordance with preferred embodiments, the at least one alloying element is an element that forms an oxide having an electrical property that is superior to an electrical property of an oxide of the metal feature in an unalloyed state.

During the conventional process for forming a pattern of damascene-type, inlaid Cu metallization features, as shown in FIGS. 1A through 1C, in some instances, for example as with unalloyed Cu inlaid metal features, a layer comprising at least one Cu oxide ($Cu_2O$, CuO, and/or $CuO_2$) may form on the upper surface(s) 6 of the metal portions 5' of the workpiece, typically as a result of oxidation by oxidants included in the CMP abrasive slurry and/or by exposure of the freshly abraded surface(s) to an oxidizing atmosphere (e.g., air) after planarization processing. The Cu oxide layer(s) may result, inter alia, in poor adhesion, increased contact resistance, and reduced conductivity or disconnect due to separation, as by peeling, of the Cu oxide layer from conductor layers in contact therewith. The Cu oxide layer may also increase electromigration of Cu atoms and/or ions from the metallization features along the oxide layer.

The present invention advantageously diffuses at least one alloying element within the metallization features such that, under conditions wherein an oxide layer may form on the surface of the metallization features, the at least one alloying element may form a more chemically and mechanically stable oxide layer on the surface of the metal feature than an oxide layer that would be formed on the surface of the metallization features in the absence of the diffused at least one alloying element. The increased stability of the oxide layer formed by the alloying element advantageously results in improved adhesion characteristics, decreased contact resistance, and more reliable vias, interlevel metallization, and/or interconnection lines. In addition, electromigration of atoms and/or ions of the conductive metal along the oxide layer is inhibited or substantially prevented, thus increasing the overall reliability of the electrical device.

The present invention thus provides a simple, convenient, and reliable method for reducing, or substantially preventing, deleterious electromigration of metal from inlaid metallization features along an oxide layer by diffusing an alloying element below the upper surfaces of the metallization features. The present invention enables the formation of extremely reliable interconnect members and patterns, illustratively, but not limited to, Cu, by providing a method for reliably reducing, or substantially preventing, deleterious electromigration. The inventive methodology also provides a substantial increase in the reliability and adhesion of damascene-type metallization patterns utilized in semiconductor "back-end" processing and is equally applicable to "dual-damascene" type processing. Furthermore, the inventive methodology eliminates the need for an additional reducing agent treatment to remove deleterious oxides such as, but not limited to, Cu oxides such as $Cu_2O$, CuO, and $CuO_2$.

The inventive methodology enjoys particular utility in the manufacture of semiconductor devices having sub-micron dimensioned metallization features and high aspect ratio openings. Moreover, the inventive methodology can be practiced according to requirements for economic competitiveness, and is fully compatible with conventional process flow for automated manufacture of high-density integration semiconductor devices. In addition, the invention is particularly well suited to the manufacture of circuit boards and other types of electrical and electronic devices and/or components.

In the previous description, numerous specific details are set forth, such as specific materials, structures, reactants, processes, etc., in order to provide a better understanding of the present invention. However, the present invention can be practiced without resorting to the details specifically set forth. In other instances, well known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A semiconductor device comprising:
   a substrate including a layer of a dielectric material;
   at least one metal feature inlaid in the layer of dielectric material, the at least one metal feature comprising at least one alloying element; and
   a layer of an oxide layer of the at least one alloying element formed on an exposed surface of the alloyed at least one metal feature,
   wherein the at least one alloying element is an element that forms an oxide that provides an electrical property that is superior to an electrical property of an oxide of the metal feature in an unalloying state.

2. The semiconductor device recited in claim 1, wherein the at least one alloying element comprises at least one of tin (Sn), zirconium (Zr), magnesium (Mg), and palladium (Pd).

3. The semiconductor device recited in claim 1, wherein the oxide of the at least one alloying element comprises at least one of tin oxide (SnO), zirconium oxide ($ZrO_2$), magnesium oxide (MgO), and palladium oxide ($PdO_2$).

4. The semiconductor device recited in claim 1, wherein the at least one metal feature comprises unalloyed copper (Cu) and wherein the oxide of the at least one alloying element provides superior resistance to electomigration of copper (Cu) atoms or ions.

5. The semiconductor device recited in claim 1, wherein the at least one metal feature comprises unalloyed copper (Cu) and wherein the oxide of the at least one alloying element provides superior contact resistance.

6. The semiconductor device recited in claim 1, wherein the substrate comprises one of monocrystalline silicon (Si) and gallium arsenide (GaAs), and the at least one metal feature comprises at least one of an inlaid via, an interlevel metallization, and an interconnection line.

7. The semiconductor device recited in claim 1, further comprising an encapsulation layer over the at least one metal feature.

8. The semiconductor device recited in claim 7, wherein the encapsulation layer comprises silicon nitride.

* * * * *